United States Patent [19]
Cho

[11] Patent Number: 5,981,993
[45] Date of Patent: Nov. 9, 1999

[54] FLASH MEMORY DEVICE AND METHOD OF FABRICATING THE SAME

[75] Inventor: Won-Ju Cho, Cheongju, Rep. of Korea

[73] Assignee: LG Semicon Co., Ltd., Choongcheongbuk-Do, Rep. of Korea

[21] Appl. No.: 08/965,232

[22] Filed: Nov. 6, 1997

[30] Foreign Application Priority Data

Mar. 5, 1997 [KR] Rep. of Korea .......................... 97-7163

[51] Int. Cl.$^6$ .................................................. H01L 29/72
[52] U.S. Cl. .......................... 257/311; 257/314; 257/324; 257/635; 257/758; 257/773; 438/257; 438/267; 438/694; 438/700
[58] Field of Search .................................... 257/311, 314, 257/324, 635, 758, 773; 438/257, 267, 694, 700

[56] References Cited

U.S. PATENT DOCUMENTS

5,684,315  11/1997  Uchiyama et al. ...................... 257/311

*Primary Examiner*—Edward Wojciechowicz

[57] ABSTRACT

A semiconductor memory device and method of fabricating the same includes a first insulation layer and a first conductive layer formed on a substrate; conductive sidewall spacers protruding upwardly on the sides of the first conductive layer; a second insulation layer formed on the substrate and covering the conductive sidewall spacers; a second conductive layer, a third insulation layer, a third conductive layer, and a fourth insulation layer sequentially formed on the second insulation layer; a contact hole formed through the second and third conductive layers and the second through fourth insulation layers; insulative sidewall spacers formed on the sidewalls of the contact hole; and a fourth conductive layer formed in the contact hole so as to be in contact with the first conductive layer. The gate structure of the semiconductor memory device effectively prevents electrons from tunneling from the fourth conductive layer (data line) to the third conductive layer (control gate) through the inter-layer insulation layer formed on the second conductive layer (floating gate) by providing a strong electrical field at the upper tips of the conductive sidewall spacers, though a low voltage is applied to the gate electrode of the semiconductor memory device.

24 Claims, 7 Drawing Sheets

FLASH MEMORY DEVICE AND METHOD OF FABRICATING THE SAME

BACKGROUND OF THE INVENTION

1. Field of the Invention

The present invention relates to a semiconductor memory device, and more particularly to an improved gate structure of a flash memory device and a method of fabricating the same, which allows programming and erasing operations using a low applying voltage.

2. Description of the Background Art

Figure 1:
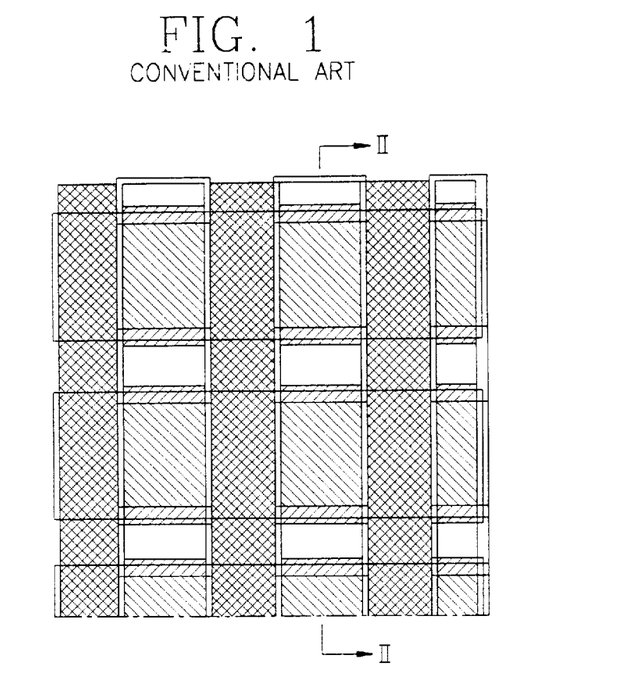
FIG. 1 is a layout view of a gate structure of a conventional flash memory device.
Figure 2:
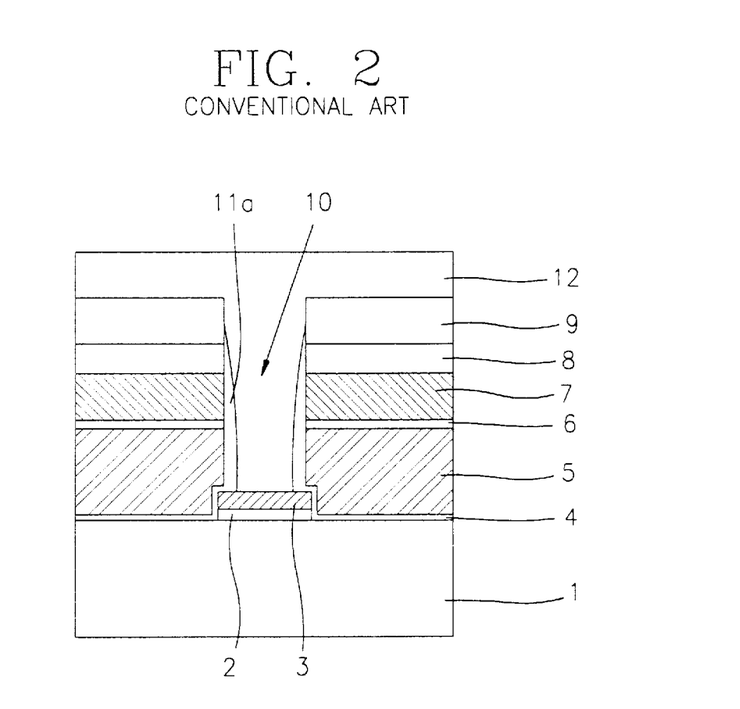
FIG. 2 is a schematic cross-sectional view taken along line II—II in FIG. 1.

FIG. 1 shows a layout of a conventional gate structure of a flash memory device, FIG. 2 shows a cross-sectional view taken along line II—II in FIG. 2, and FIGS. 3A–3E show cross-sectional views of the conventional gate structure illustrating a conventional method of forming the same.

As shown in FIG. 2, the conventional gate structure of a flash memory device includes a semiconductor substrate 1, a gate insulation film 2 formed on a portion of the substrate 1, a first polysilicon film 3 formed on the gate insulation film 2 and serving as a gate electrode, and a tunnel insulation film 4 formed over the substrate 1, the gate insulation film 2 and the gate electrode 3. The tunnel insulation film 4 is thinner than the gate insulation film 2.

The conventional gate structure further includes a second polysilicon film 5 serving as a floating gate, an inter-dielectric film 6 formed on the second polysilicon film 5, a third polysilicon film 7 serving as a control gate, an insulation film 8 formed on the third polysilicon film 7, and a leveling film 9 formed on the insulation film 8. The gate structure also includes a contact hole 10 for exposing an upper surface of the gate electrode 3, sidewall spacers 11a formed on the sidewalls of the contact hole 10, and a metallic layer 12 formed on the leveling film 9 and in the contact hole 10.

Referring to FIGS. 3A through 3E, the conventional method of forming the above-described gate structure of the flash memory device will now be described.

Figure 3A:
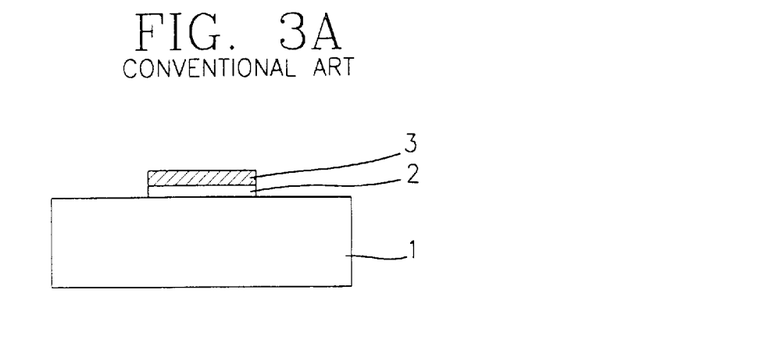
FIGS. 3A through 3E are cross-sectional views illustrating a conventional method of forming the conventional flash memory device of FIG. 1.

As shown in FIG. 3A, a gate insulation film is deposited on the substrate 1 by chemical vapor deposition (CVD) and patterned to form a gate insulation film 2. A first polysilicon film 3 is formed on the gate insulation film 2.

Figure 3B:
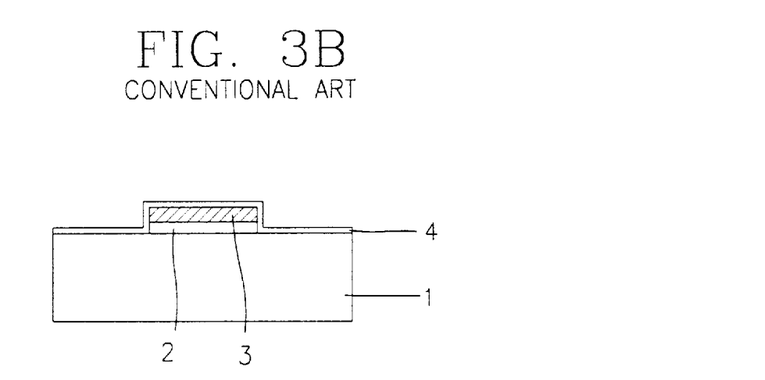

As shown in FIG. 3B, a thermal oxidizing process is performed on the substrate 1 and first polysilicon film 3 so as to form a tunnel insulation film 4 which is thinner than the gate insulation film 2.

Figure 3C:
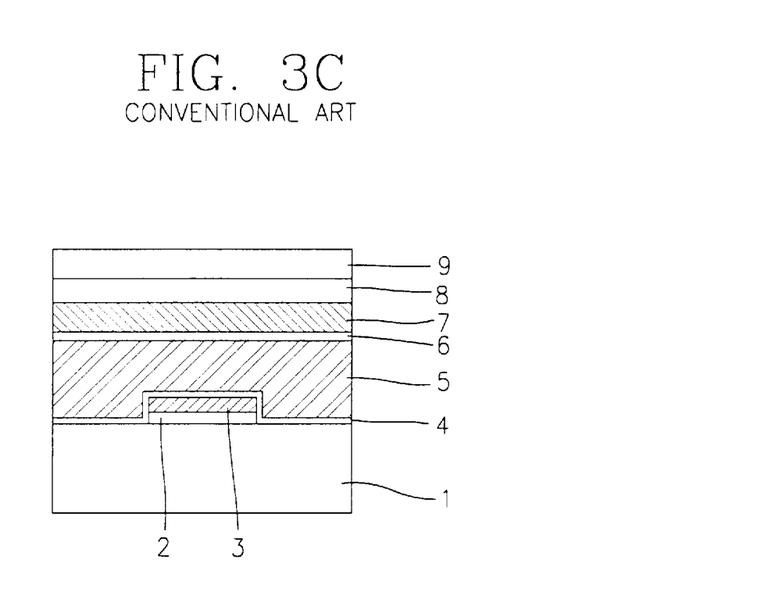

As shown in FIG. 3C, a second polysilicon film 5, an inter-dielectric film 6, a third polysilicon film 7 and an insulation film 8 are sequentially formed on the tunnel insulation film 4. A boron phosphorous silicate glass (BPSG) is coated on the insulation film 8 and etched back to form a leveling film 9.

Figure 3D:
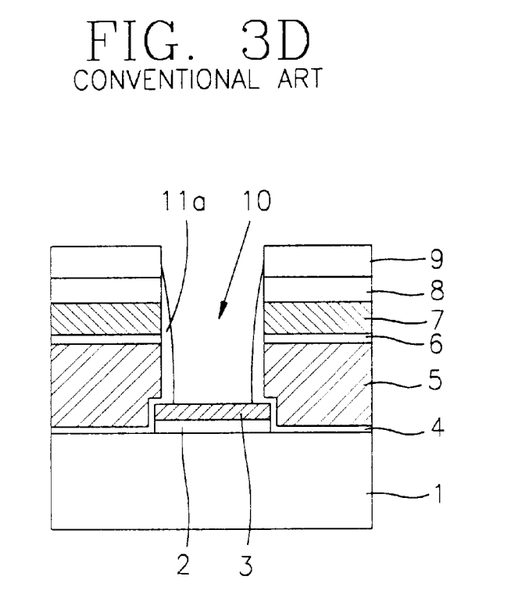

As shown in FIG. 3D, using an etching mask, portions of the leveling film 9, insulation film 8, third polysilicon film 7, inter-dielectric film 6, second polysilicon film 5 and tunnel insulation film 4 are etched to form a contact hole 10 therethrough. An insulation film is deposited in the contact hole 10 and on the leveling film 9, and etched back using CVD to form sidewall spacers 11a on the sidewalls of the contact hole 10.

Figure 3E:
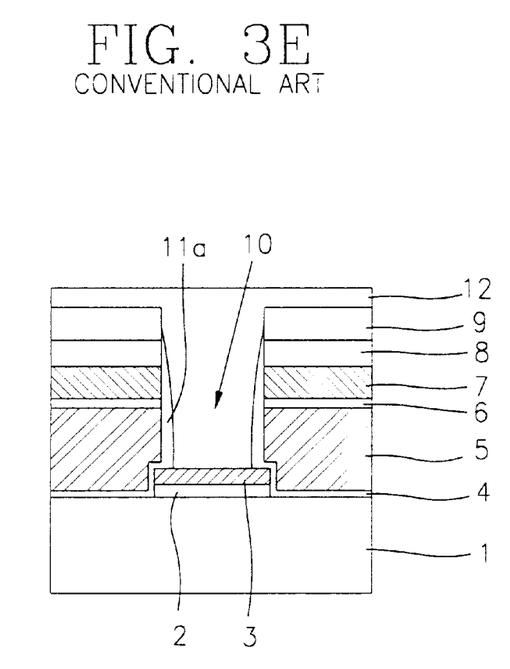

As shown in FIG. 3E, a metallic layer 12 is formed on the leveling film 9 and in the contact hole 10, thereby completing the formation of gate structure of the conventional flash memory device.

In the conventional flash memory device, a negative voltage is applied to the gate electrode 3, a positive voltage is applied to the control gate 7, a positive low voltage is applied to a drain region (not shown), and a ground potential is applied to a source region. Thereafter, electrons are implanted from the gate electrode 3 into the floating gate 5 using a Fowler Nordheim (FN) tunneling method to program the device. A MOSFET (metal oxide silicon field effect transistor) of the flash memory device monitors the programming operation. The amount of electrons injected into the floating gate 5 depends on time. As more electrons are injected into the floating gate 5, the less current flows through the drain region which increase the threshold voltage of the device. Therefore, when programming is performed on a cell array, the threshold voltage of all of the cells being programmed can be controlled to converge to a certain value, automatically.

Meanwhile, when a bias (which is an opposite type to the bias condition applied to the device during programming) is applied to perform an erasure operation in the conventional flash memory device, the electrons accumulated in the floating gate 5 in accordance with the FN tunneling method are implanted into a source/drain region or a channel region, thereby increasing the current flowing through the drain and decreasing the threshold voltage of the device.

The conventional flash memory device, however, provides weak electric field between the gate electrode 5 and the control gate 7 in accordance with an applied bias voltage. As a result, there may occur at times erroneous operations when the electrons are not injected from the floating gate 5 to the control gate 7.

Furthermore, if the applied voltage is raised to a higher level, there is a problem of electrons tunneling from a data line (metallic layer) 12 directly to the control gate 7.

SUMMARY OF THE INVENTION

Accordingly, it is an object of the present invention to provide a gate structure of a flash memory device which makes it possible to perform programming and erasure operations at a low voltage using polysilicon sidewall spacers having a height greater than that of a first polysilicon film.

To achieve the above-described and other objects, there is provided a gate structure of a flash memory device according to the embodiments of the present invention which includes a first insulation film formed on a portion of a semiconductor substrate; a first conductive film and conductive sidewall spacers protruding upwardly on each side of the first conductive film; a second insulation film formed on the substrate and on respective portions of the first insulation film, the first conductive film and the conductive sidewall spacers; a second conductive film, a third insulation film, a third conductive film forming a gate, and a fourth insulation film which are sequentially formed on the second insulation film; a contact hole exposing an upper surface of the first conductive film; insulative sidewall spacers serving as a fifth insulation film and formed on the sidewalls of the contact hole; and a fourth conductive film formed on the fourth insulation film and filling the contact hole so as to be in contact with the first conductive film.

Further, to achieve the above-described and other objects, there is provided a method of fabricating a gate structure of a flash memory device according to the embodiments of the present invention which includes the steps of forming a first insulation film on a semiconductor substrate; forming on the first insulation film a first conductive film and conductive sidewall spacers on the sides of the first conductive film, the conductive sidewall spacers protruding upwardly; forming a second insulation film on the substrate and on respective portions of the first insulation film, the first conductive film and the conductive sidewall spacers; forming sequentially a second conductive film, a third insulation film, a third conductive film as a gate, and a fourth insulation film, on the second insulation film; forming a contact hole to expose an upper surface of the first conductive film; forming insulative sidewall spacers serving as a fifth insulation film on the sidewalls of the contact hole; and forming a fourth conductive film on the fourth insulation film and in the contact hole so that the fifth insulation film contacts with the first conductive film through the contact hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a semiconductor memory device including a first insulation layer and a first conductive layer formed on a substrate; conductive sidewall spacers protruding upwardly on the sides of the first conductive layer; a second insulation layer formed on the substrate and covering the conductive sidewall spacers; a second conductive layer, a third insulation layer, a third conductive layer, and a fourth insulation layer sequentially formed on the second insulation layer; a contact hole formed through the second insulation layer; insulative sidewall spacers formed on the sidewalls of the contact hole; and a fourth conductive layer formed in the contact hole so as to be in contact with the first conductive layer.

Furthermore, the present invention is directed to a method of fabricating a semiconductor memory device, including the steps of forming a first insulation layer and a first conductive layer on a substrate; forming conductive sidewall spacers on the sides of the first conductive layer; forming a second insulation film on the substrate and over the conductive sidewall spacers; sequentially forming a second conductive film, a third insulation film, a third conductive layer, and a fourth insulation layer on the second insulation layer; forming a contact hole to expose a surface of the first conductive layer; forming insulative sidewall spacers on the sidewalls of the contact hole; and forming a fourth conductive layer in the contact hole so as to be in contact with the first conductive layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

With reference to the accompanying drawings, a gate structure of a flash memory device according to the present invention will now be described.

Figure 4:
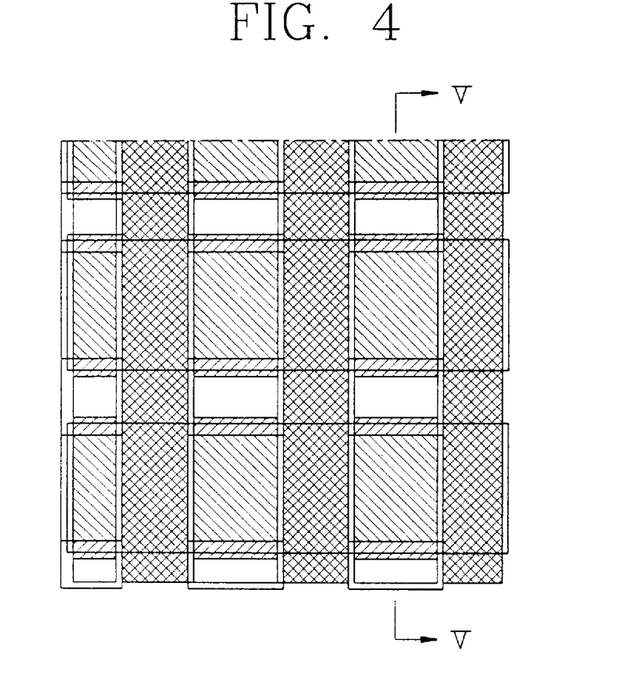
FIG. 4 is a layout view of a gate structure of a flash memory device according to the embodiments of the present invention.
Figure 5:
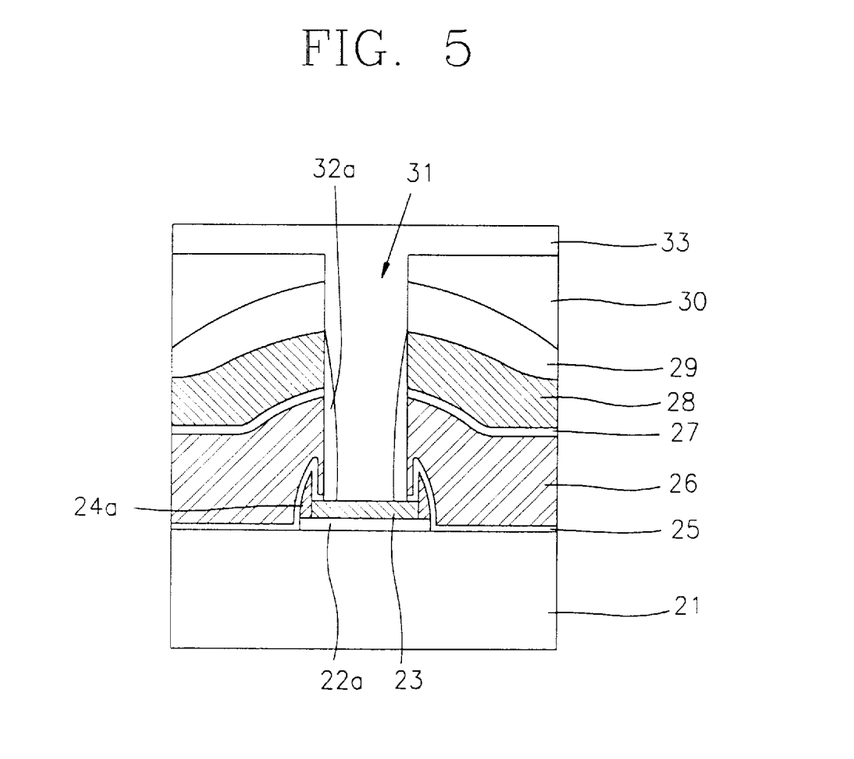
FIG. 5 is a schematic cross-sectional view taken along line V—V in FIG. 4.

FIG. 4 shows a layout of a gate structure of a flash memory device according to the present invention, wherein its construction will be described with reference to FIGS. 5 and 6A–6G. FIG. 5 shows a cross-sectional view taken along line V—V in FIG. 4.

As shown in FIG. 5, the gate structure of the flash memory device according to the present invention includes a semiconductor substrate 21; a gate insulation film 22a formed on a portion of the substrate 21 and serving as a first insulation film; a first conductive film 23 formed with polysilicon on the gate insulation film 22a; conductive sidewall spacers 24a formed with polysilicon on the sides of the first conductive film 23; a tunnel insulation film 25 formed on the substrate 21 and portions of the gate insulation film 22a, the first conductive film 23 and the conductive sidewall spacers 24a, and serving as a second insulation film; a second conductive film 26 formed on the tunnel insulation film 25 and serving as a floating gate; an inter-layer (dielectric) insulation film 27 formed on the second conductive film 26 and serving as a third insulation film; a third conductive film 28 serving as a control gate; a fourth insulation film 29 formed on the third conductive film 28; a leveling film 30 formed on the fourth insulation film 29; a contact hole 31 formed through the leveling film 30, the fourth insulation film 29, the third conductive film 28, the third insulation film 27, the second conductive film 26 and the tunnel insulation film 25 to expose an upper surface of the first conductive film 23; insulative sidewall spacers 32a formed on the sidewalls of contact hole 31 and serving as a fifth insulation film; and a fourth conductive film 33 formed on the leveling film 30 and filling the contact hole 31. The second conductive film 26, the third insulation film 27, the third conductive film 28, the fourth insulation film 29 and the levelling film 30 are sequentially formed on the tunnel insulation film 25.

With reference to FIGS. 6A through 6G, the method of fabricating the gate structure of the flash memory device according to the embodiments of the present invention will now be described.

Figure 6A:
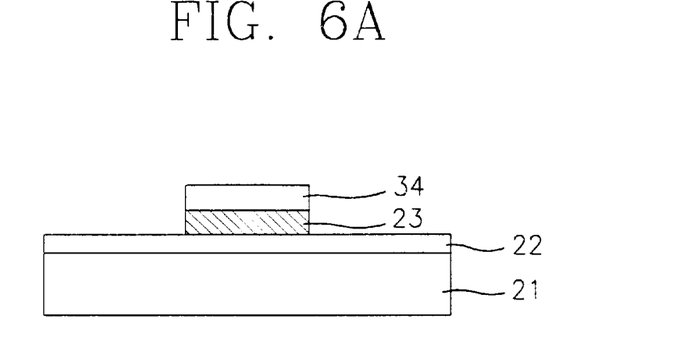
FIGS. 6A through 6G are cross-sectional views for illustrating a method of forming a flash memory device having a gate structure according to the embodiments of the present invention.

As shown in FIG. 6A, a first insulation film 22 is formed on a semiconductor substrate 21. A first conductive film 23 is grown on the first insulation film 22 using a chemical vapor deposition (CVD) process. Another insulation film 34 made with silicon oxide or silicon nitride is formed on the first conductive film 23.

Figure 6B:
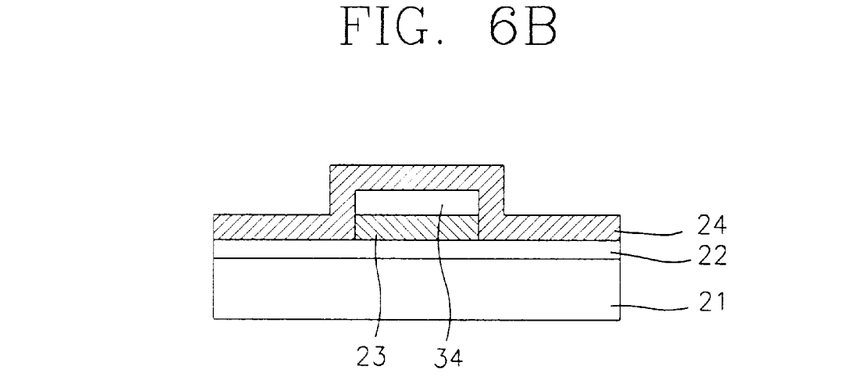

As shown in FIG. 6B, a second conductive film 24 is formed on the first insulation film 22 and over the first conductive film 23 and insulation film 34 using a CVD process.

Figure 6C:
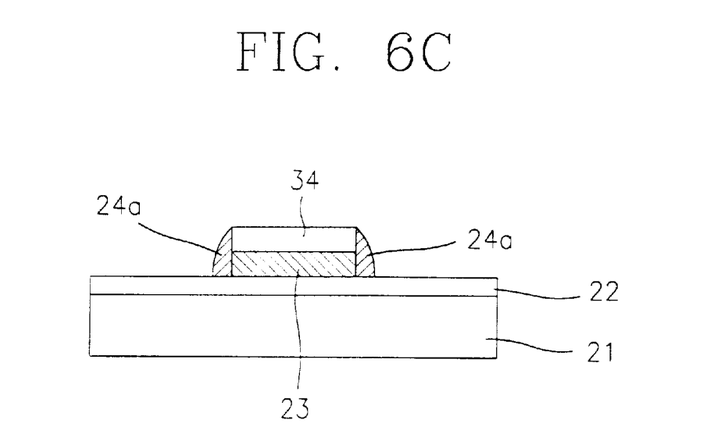

As shown in FIG. 6C, the second conductive film 24 is etched back, without the use of an etching mask, to form conductive sidewall spacers 24a on the sides of the first conductive film 23 and insulation film 34. The conductive sidewall spacers 24a project upwardly to where the insulation film 34 is, so that the height of the conductive sidewall spacers 24a is greater than that of the first conductive film 23.

Figure 6D:
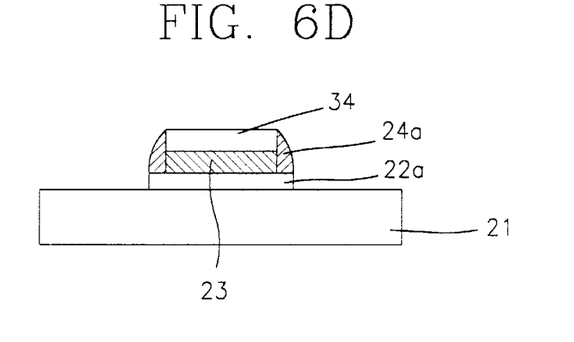

As shown in FIG. 6D, using the first conductive film 23 and the conductive sidewall spacers 24a as a mask, the insulation film 34 and portions of the first insulation film 22 are self-aligningly etched to form a patterned first insulation film 22a serving as a gate insulation film. This exposes the upper surface of the first conductive film 23 and surfaces of the substrate 21. The first conductive film 23 and the conductive sidewall spacers 24a form a first conductive layer and function as a gate electrode.

Figure 6E:
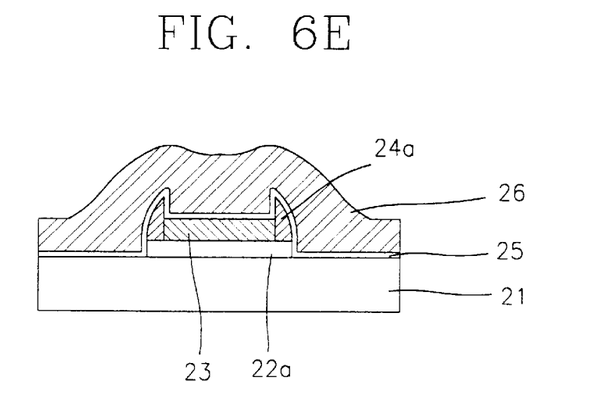

As shown in FIG. 6E, a tunnel insulation film 25 as a second insulation film is formed on the exposed surfaces of the substrate 21, the patterned first insulation film 22a, the first conductive layer 23 and the conductive sidewall spacers 24a. Then a second conductive film 26 as a floating gate is formed on the tunnel insulation film 25 by a CVD process.

Figure 6F:
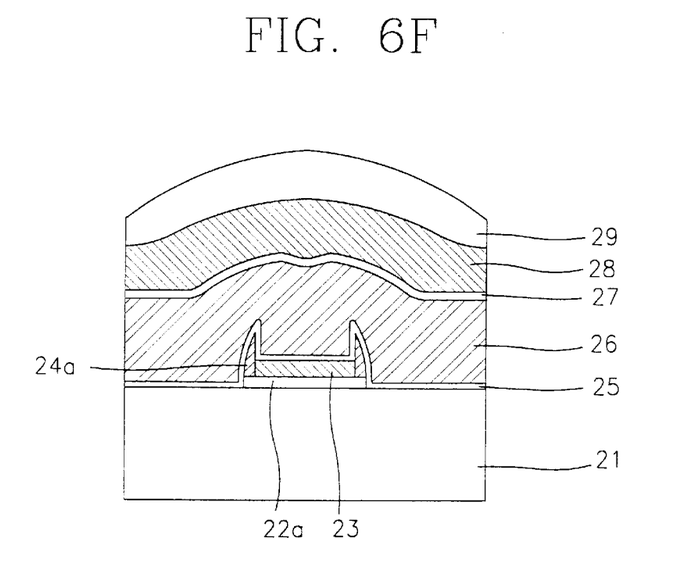

As shown in FIG. 6F, an inter-layer (dielectric) insulation film 27 as a third insulation film, a third conductive film 28 as a control gate, and a fourth insulation film 29 are sequentially formed on the second conductive film 26. Here, the third conductive film 28 is formed by a CVD process.

Figure 6G:
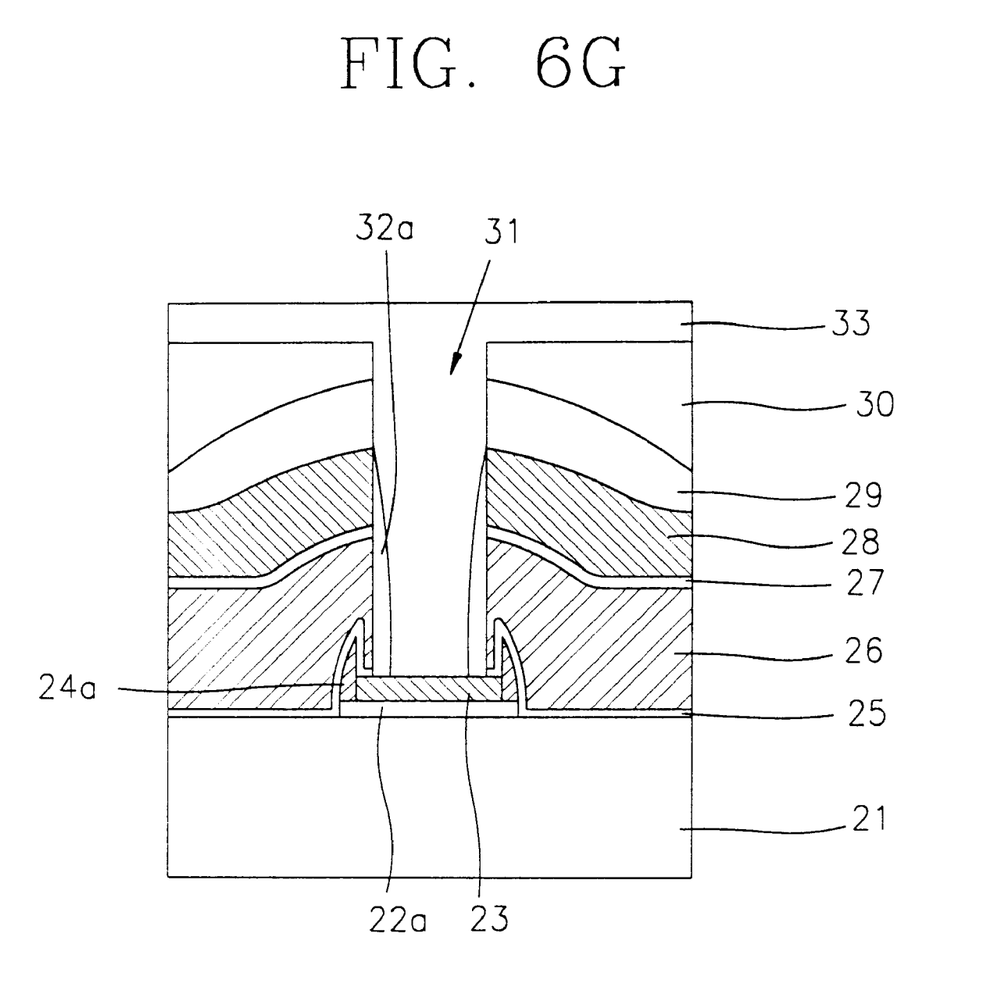

As shown in FIG. 6G, a BPSG leveling film 30 is formed on the fourth insulation film 29. A contact hole 31 is formed by selectively etching the BPSG leveling film 30, the fourth insulation film 29, the third conductive film 28, the third insulation film 27, the second conductive film 26 and the tunnel insulation film 25. The contact hole 31 exposes an upper surface of the first conductive film 23. A fifth insulation film is formed in the contact hole 31 and on th leveling film 30 by a CVD process, and is etched back to form insulative sidewall spacers 32a on the sidewalls of the contact hole 31. Then a metallic layer 33 as a fourth conductive film is formed on the leveling film 30 and fills the contact hole 31, so as to be in contact with the first conductive film 23. This completes the formation of the flash memory device having the gate structure according to the present invention.

As described above, the gate structure of the flash memory device and its fabrication method according to the embodiments of the present invention provides a strong electrical field at the upper tips of the conductive sidewall spacers 24a despite the low voltage applied thereto during programming. This prevents electrons from tunneling from the fourth conductive film (data line) 33 to the third conductive film (control gate) 28 through the inter-layer insulation film formed on the second conductive film, and it improves the programming and erasure operations of the device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
  a first insulation layer and a first conductive layer formed on a substrate;
  conductive sidewall spacers protruding upwardly on sides of the first conductive layer;
  a second insulation layer formed on the substrate and covering the conductive sidewall spacers;
  a second conductive layer, a third insulation layer, a third conductive layer, and a fourth insulation layer sequentially formed on the second insulation layer;
  a contact hole formed through the second insulation layer, insulative sidewall spacers formed on sidewalls of the contact hole; and
  a fourth conductive layer formed in the contact hole so as to be in contact with the first conductive layer.

2. The device of claim 1, further comprising:
  a leveling layer formed on the fourth insulation layer.

3. The device of claim 2, wherein the leveling layer is made with a boron phosphorous silicate glass (BPSG).

4. The device of claim 1, wherein the first conductive layer includes a first polysilicon layer formed on the first insulation layer; and wherein the conductive sidewall spacers includes a second polysilicon layer formed on each side of the first polysilicon layer.

5. The device of claim 1, wherein a height of the conductive sidewall spacers is greater than that of the first conductive layer.

6. The device of claim 1, wherein at least one of the first conductive layer, the second conductive layer and the third conductive layer is formed with polysilicon.

7. The device of claim 1, wherein the second insulation layer is thinner than the first insulation layer.

8. The device of claim 1, wherein the first conductive layer includes a gate electrode.

9. The device of claim 1, wherein the second conductive layer includes a floating gate.

10. The device of claim 1, wherein the third conductive layer includes a control gate.

11. The device of claim 1, wherein the contact hole is formed through the second and third conductive layers and the third and fourth insulation layers.

12. A method of fabricating a semiconductor memory device, comprising the steps of:
  forming a first insulation layer and a first conductive layer on a substrate;
  forming conductive sidewall spacers on sides of the first conductive layer;
  forming a second insulation layer on the substrate and over the conductive sidewall spacers;
  sequentially forming a second conductive layer, a third insulation layer, a third conductive layer, and a fourth insulation layer on the second insulation layer;
  forming a contact hole to expose a surface of the first conductive layer;
  forming insulative sidewall spacers on sidewalls of the contact hole; and
  forming a fourth conductive layer in the contact hole so as to be in contact with the first conductive layer.

13. The method of claim 12, wherein the step of forming the first conductive layer includes the step of forming a first polysilicon layer on the first insulation layer, and the step of forming the conductive sidewall spacers includes the step of forming a second polysilicon film on each side of the first polysilicon film.

14. The method of claim 12, wherein a height of the conductive sidewall spacers is greater than that of the first conductive layer.

15. The method of claim 12, wherein the steps of forming the first conductive layer and the conductive sidewall spacers include the steps of:
  forming a first polysilicon layer on the first insulation layer;
  forming an insulation layer on the first polysilicon layer;
  forming a second polysilicon layer on the insulation layer and the first insulation layer; and removing portions of the second polysilicon layer so as to form the conductive sidewall spacers on the sides of the first polysilicon layer and the insulation layer.

16. The method of claim 15, wherein the steps of forming the first conductive layer and the conductive sidewall spacers further include step of:

removing the insulation film and portions of the first insulation layer using the first conductive layer and the conductive sidewall spacers as a mask, so as to expose an upper surface of the substrate and an upper surface of the first polysilicon layer.

17. The method of claim 12, further comprising:

forming a leveling layer on the fourth insulation layer.

18. The method of claim 17, wherein the leveling layer is formed with a boron phosphorous silicate glass (BPSG).

19. The method of claim 12, wherein at least one of the first conductive layer, the second conductive layer and the third conductive layer is formed with polysilicon.

20. The method of claim 12, wherein the fourth conductive layer is formed of with a metal.

21. The method of claim 12, wherein the second conductive layer forms a floating gate.

22. The method of claim 12, wherein the third conductive layer forms a control gate.

23. The method of claim 12, wherein the first insulation layer and the second insulation layer are etched by using a self-aligning method.

24. The method of claim 12, wherein the second insulation layer is formed thinner than the first insulation layer.

* * * * *